(12) United States Patent
Lee

(10) Patent No.: US 10,964,592 B2
(45) Date of Patent: Mar. 30, 2021

(54) METHODS OF FORMING CONDUCTIVE VIAS AND METHODS OF FORMING MEMORY CIRCUITRY

(71) Applicant: Micron Technology, Inc., Boise, ID (US)

(72) Inventor: Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 16/299,469

(22) Filed: Mar. 12, 2019

(65) Prior Publication Data

US 2020/0294852 A1 Sep. 17, 2020

(51) Int. Cl.
  *H01L 21/768* (2006.01)
  *H01L 21/308* (2006.01)
  *H01L 27/108* (2006.01)

(52) U.S. Cl.
  CPC .... *H01L 21/76897* (2013.01); *H01L 21/3086* (2013.01); *H01L 21/76805* (2013.01); *H01L 27/10885* (2013.01); *H01L 27/10891* (2013.01)

(58) Field of Classification Search
  CPC combination set(s) only.
  See application file for complete search history.

(56) References Cited

U.S. PATENT DOCUMENTS

| | | | | |
|---|---|---|---|---|
| 7,737,039 B2 * | 6/2010 | Sandhu | ................ | H01L 23/528 438/696 |
| 9,209,077 B2 * | 12/2015 | Myers | ............... | H01L 21/76808 |
| 9,666,687 B1 * | 5/2017 | Lee | ..................... | H01L 29/6653 |
| 10,062,571 B2 * | 8/2018 | Yoon | ................. | H01L 21/02282 |
| 2011/0003469 A1 * | 1/2011 | Kewley | ............ | H01L 21/28008 438/591 |
| 2012/0045896 A1 * | 2/2012 | Sipani | ............... | H01L 21/76816 438/675 |
| 2014/0256140 A1 * | 9/2014 | Sipani | ................. | H01L 21/0337 438/703 |

* cited by examiner

*Primary Examiner* — Mounir S Amer
(74) *Attorney, Agent, or Firm* — Wells St. John P.S.

(57) ABSTRACT

A method of forming conductive vias of integrated circuitry comprises forming first openings in a first masking material, with the first openings being spaced along a line passing across the first openings. Sidewalls of the first openings are lined with a second masking material to form a ring within individual of the first openings and a second opening within the individual first openings radially inside of the ring. The first masking material is removed along the line to form a void space between immediately-adjacent of the rings. A mask is formed that comprises the rings and a third opening in third masking material, with the third opening extending along the line above and across multiple of the rings and multiple of the second openings. The mask is used as an etch mask while etching into substrate material that is exposed through the third opening to form contact openings in the substrate material that are spaced along the line. Conductive material is formed in the contact openings to form conductive vias.

29 Claims, 13 Drawing Sheets

Predecessor Construction

US 10,964,592 B2

METHODS OF FORMING CONDUCTIVE VIAS AND METHODS OF FORMING MEMORY CIRCUITRY

TECHNICAL FIELD

Embodiments disclosed herein pertain to methods of forming conductive vias and to methods of forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array and the wordlines may conductively interconnect memory cells along rows of the array. Each memory cell may be uniquely addressed through the combination of a digitline and a wordline.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

Arrays of memory cells may comprise a plurality of wordlines at one elevation and a plurality of digitlines at another elevation. Individual of the memory cells may effectively be provided between and/or proximate such lines where they cross. Individual memory cells can be written to or read from by application of suitable voltage and/or current to the respective crossing wordline and digitline. An elevationally-elongated (e.g., vertical) conductive via may be provided to each wordline and to each digitline to apply such voltage and/or current to the selected lines. Only one conductive via is commonly fabricated for each line, although multiple conductive vias may be provided to electrically couple to the same line.

A continuing goal in fabrication of memory and other integrated circuitry is to make ever smaller and closer packed circuit components. As integrated circuitry density has increased, there is often greater reduction in the horizontal dimension of circuit components as compared to the vertical dimension. In many instances, the vertical dimension has increased. Conductive vias formed in contact openings are commonly used for electrically coupling circuit components that are at different elevations relative to one another. As circuit components become smaller and closer together, it becomes increasingly difficult to control critical dimension, mask alignment, and provide acceptable margins of error when forming contact openings to lower elevation circuit components.

DETAILED DESCRIPTION OF EXAMPLE EMBODIMENTS

Embodiments of the invention encompass methods of forming conductive vias and methods of forming memory circuitry that comprises conductive vias. First example method embodiments are described with reference to FIGS. 1-20.

Figure 1:
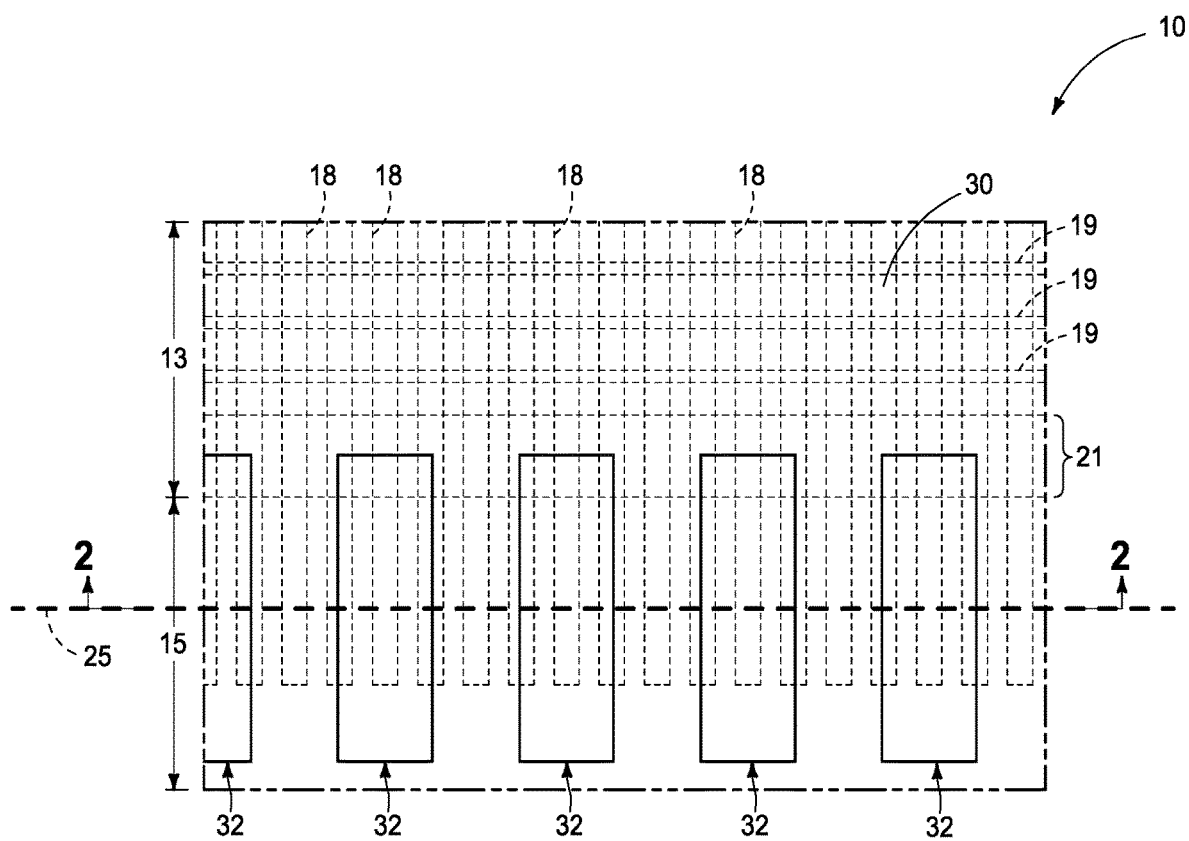
FIG. 1 is a diagrammatic cross-sectional view of a portion of a substrate construction in process in accordance with an embodiment of the invention and is taken through line 1-1 in FIG. 2.
Figure 2:
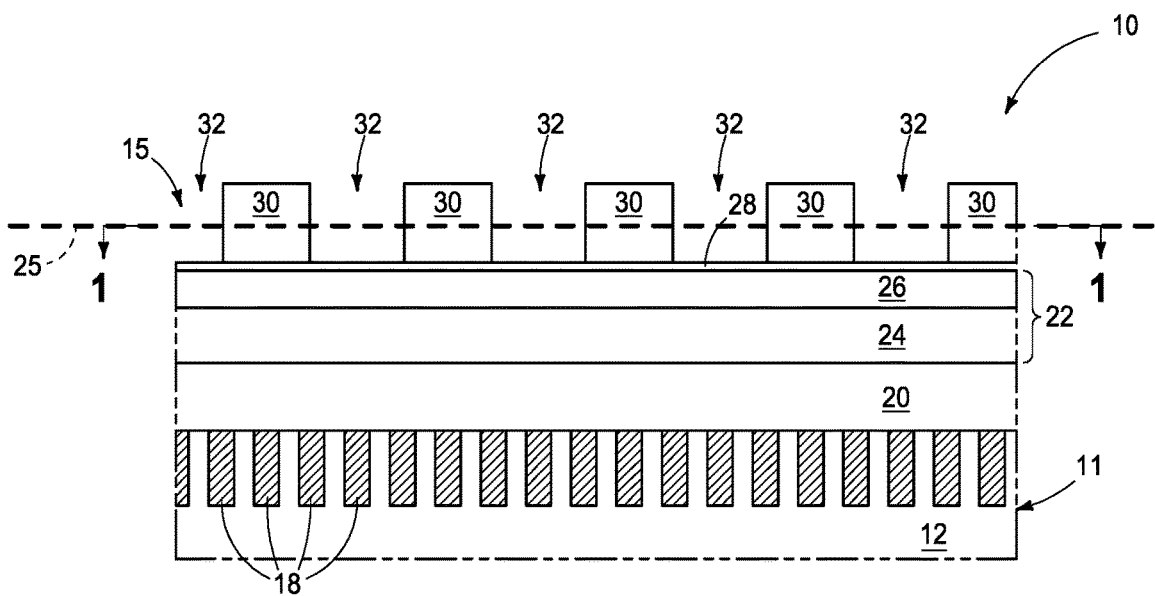
FIG. 2 is a diagrammatic cross-sectional view taken through line 2-2 in FIG. 1.

FIGS. 1 and 2 show a construction 10 in a method of forming integrated circuitry, for example comprising memory circuitry such as a DRAM circuitry. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., a memory array) may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Construction 10 may be considered as comprising a first substrate area 13 and a second substrate area 15. In one embodiment, area 13 is a memory array area and area 15 is a peripheral circuitry area that is adjacent, in one embodiment immediately adjacent, the memory array area. In one embodiment, a plurality of conductive lines extends longitudinally from first substrate area 13 into second substrate area 15. In one such embodiment where area 13 is a memory array area and area 15 is a peripheral circuitry area, the conductive lines comprise a series of (a) wordlines, or (b) digitlines. In the example embodiment of FIGS. 1 and 2, a series of wordline constructions 18 is shown. Such may be received within trenches in semiconductive material 12 (e.g., appropriately and variously doped monocrystalline and/or polycrystalline silicon, Ge, SiGe, GaAs, and/or other existing or future-developed semiconductive material) as part of base substrate 11. Material 12 may be semiconductive islands (not shown) in area 13 which are surrounded by trench isolation (not shown) and material 12 may be insulative in area 15 (e.g., silicon dioxide and/or silicon nitride). As an example, a memory array area (e.g., 13) may comprise transistor devices individually comprising a pair of source/drain regions (not shown), a channel region (not shown) between the pair of source/drain regions, a conductive gate (not shown) operatively proximate the channel region, and a gate insulator (not shown) between the conductive gate and the channel region. Example such transistor devices may be what are commonly referred to as recessed access devices which individually include a buried access line/wordline construction 18, for example that are in individual trenches in area 13 and in area 15. Example outlines of digitlines 19 and a dummy digitline 21 within example memory array area 13 are shown. Digitlines 19, 21 may not yet be fabricated in the example method.

Example substrate construction 10 comprises dielectric material 20 (e.g., silicon dioxide and/or silicon nitride) above conductive lines 18 and material 12. In one embodiment, hard-masking material 22 and an antireflective coating 28 (e.g., $Si_xO_yN_z$) are above hard-masking material 22. Example hard-masking material 22 is shown as comprising material 26 (e.g., silicon nitride) above material 24 (e.g., carbon).

A first masking material 30 (e.g., photoresist) is above antireflective coating 28. First openings 32 have been formed in first masking material 30 and are spaced along a line 25 passing across first openings 32 in second substrate area 15. In one embodiment and as shown, line 25 is straight, although in another embodiment such line is not straight (not shown). By way of example only, first openings 32 are shown as being elongated rectangles extending from first substrate area 13 to second substrate area 15, although other shapes may be used and first openings 32 need not be in both first substrate area 13 and second substrate area 15. In one embodiment and as shown, individual first openings 32 are longitudinally elongated parallel conductive lines 18.

Figure 3:
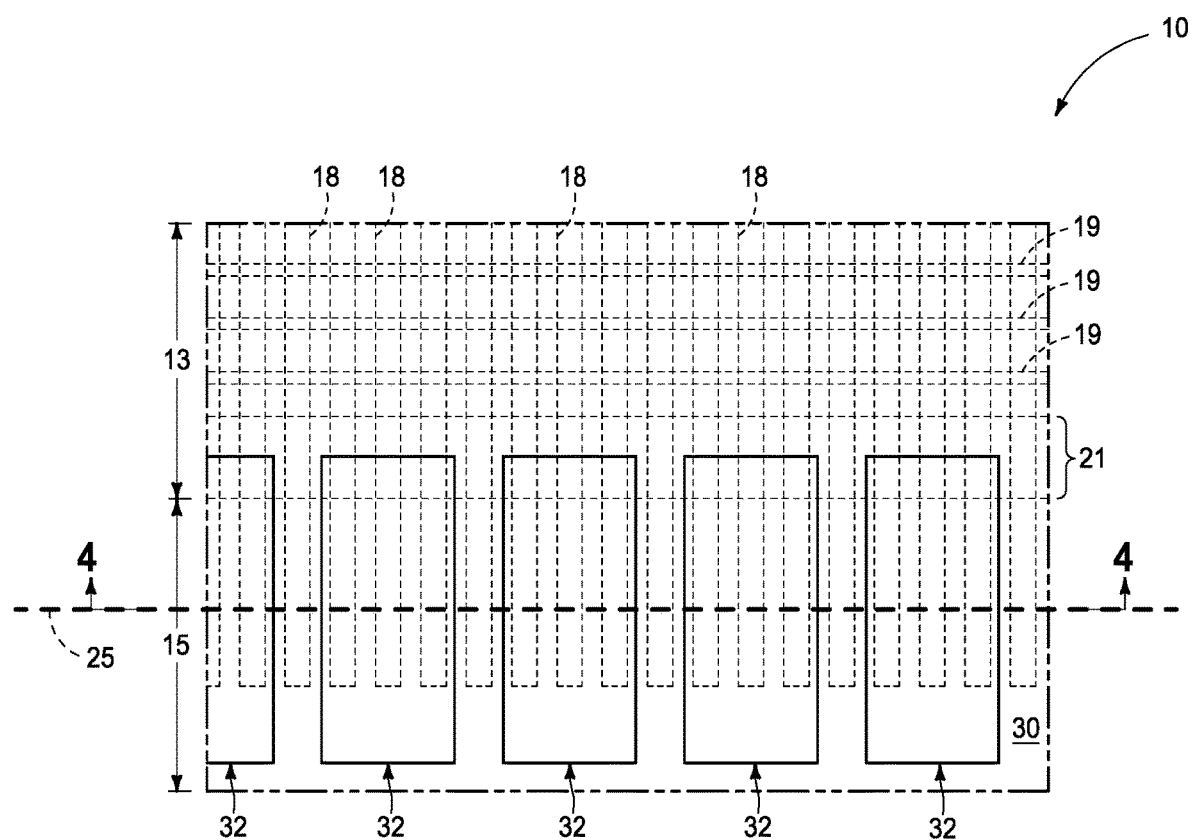
FIGS. 3-20 are diagrammatic sequential cross-sectional views of the construction of FIGS. 1 and 2 in process in accordance with some embodiments of the invention.
Figure 4:
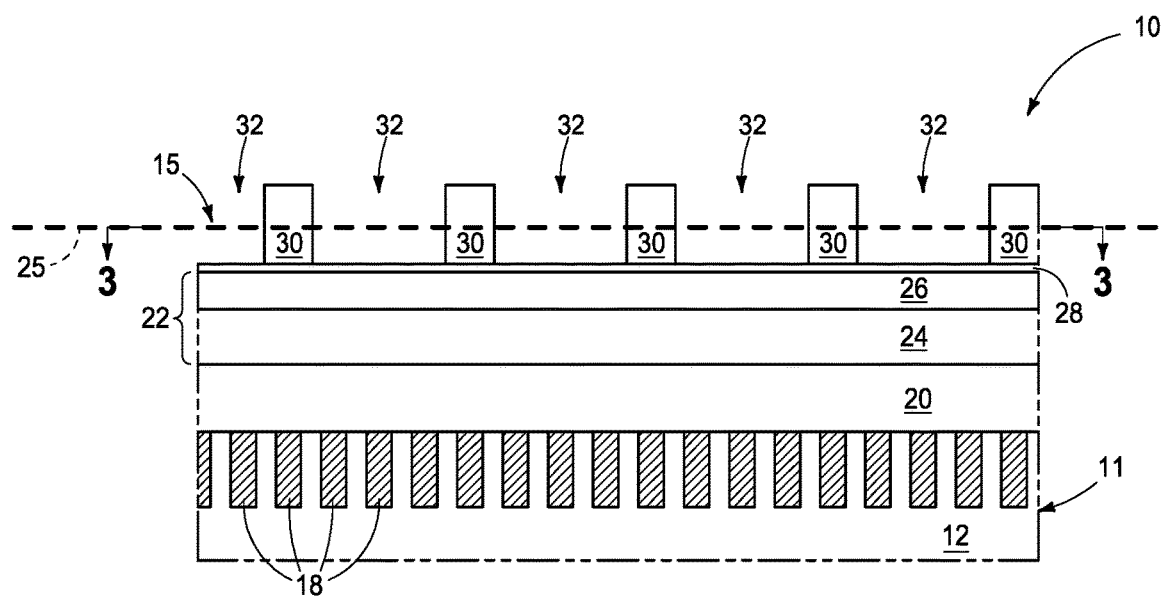

In one embodiment, openings 32 may be considered as narrower first openings in first masking material 30. Referring to FIGS. 3 and 4, first masking material 30 has been laterally etched (e.g., trimmed) to transform narrower first openings 32 of FIGS. 1 and 2 into wider first openings 32 in FIGS. 3 and 4. Wider openings 32 may and likely would also be longitudinally elongated (not shown) by such act of etching first masking material 30.

Figure 5:
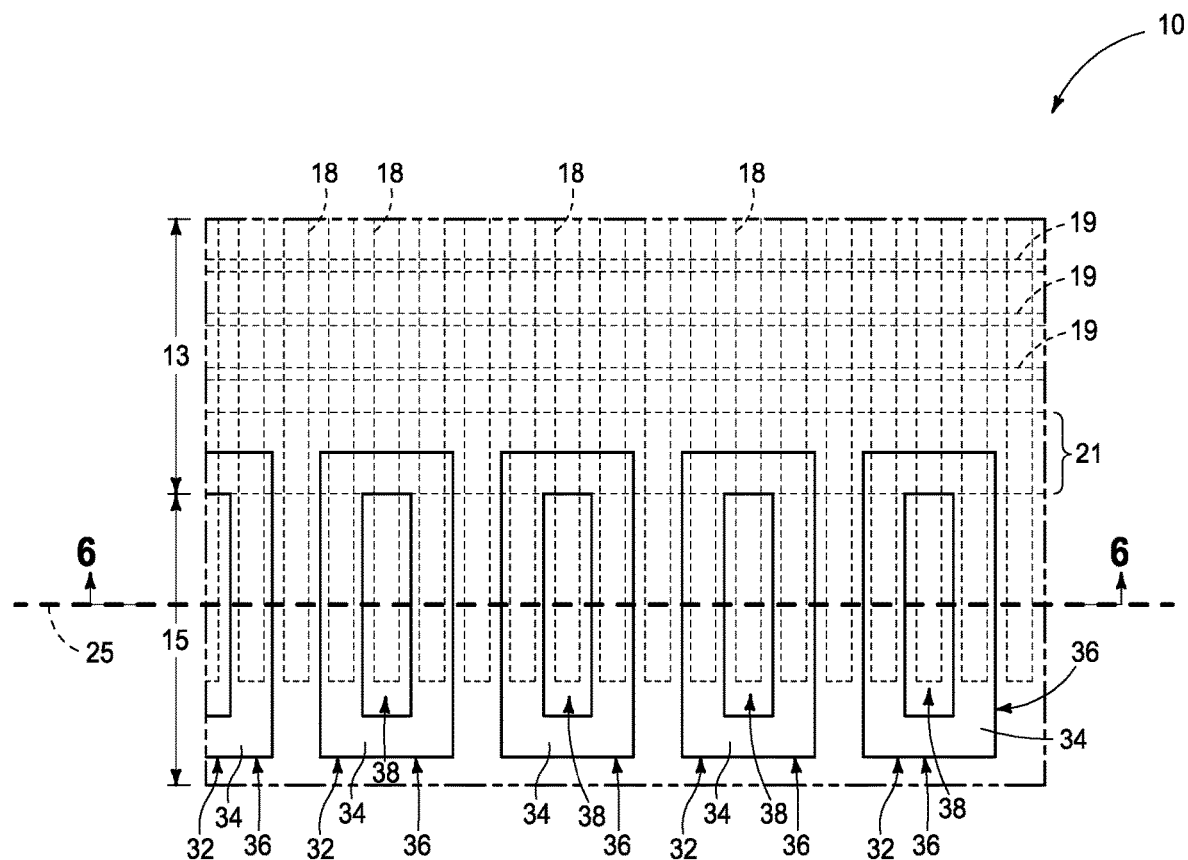
Figure 6:
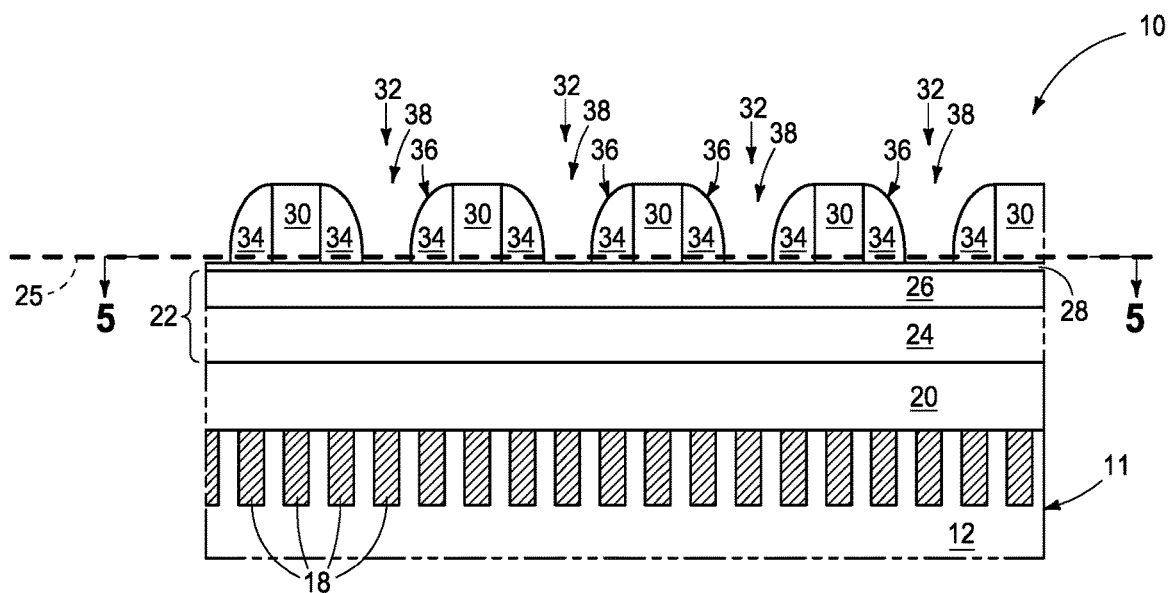

Referring to FIGS. 5 and 6, sidewalls of first openings 32 have been lined with a second masking material 34 to form a ring 36 within individual first openings 32, in one embodiment within widened first openings 32, and a second opening 38 within individual first openings 32 radially inside of ring 36. In one embodiment and as shown, individual second openings 38 are directly above a single individual conductive line 18 in second substrate area 15. In one embodiment and as shown, rings 36 are individually longitudinally elongated parallel conductive lines 18. In one embodiment, first masking material 30 and second masking material 34 are of different compositions relative one another. Regardless, an example second masking material is silicon dioxide. In one embodiment and as shown, rings 36 are individually longer than they are wide.

Figure 7:
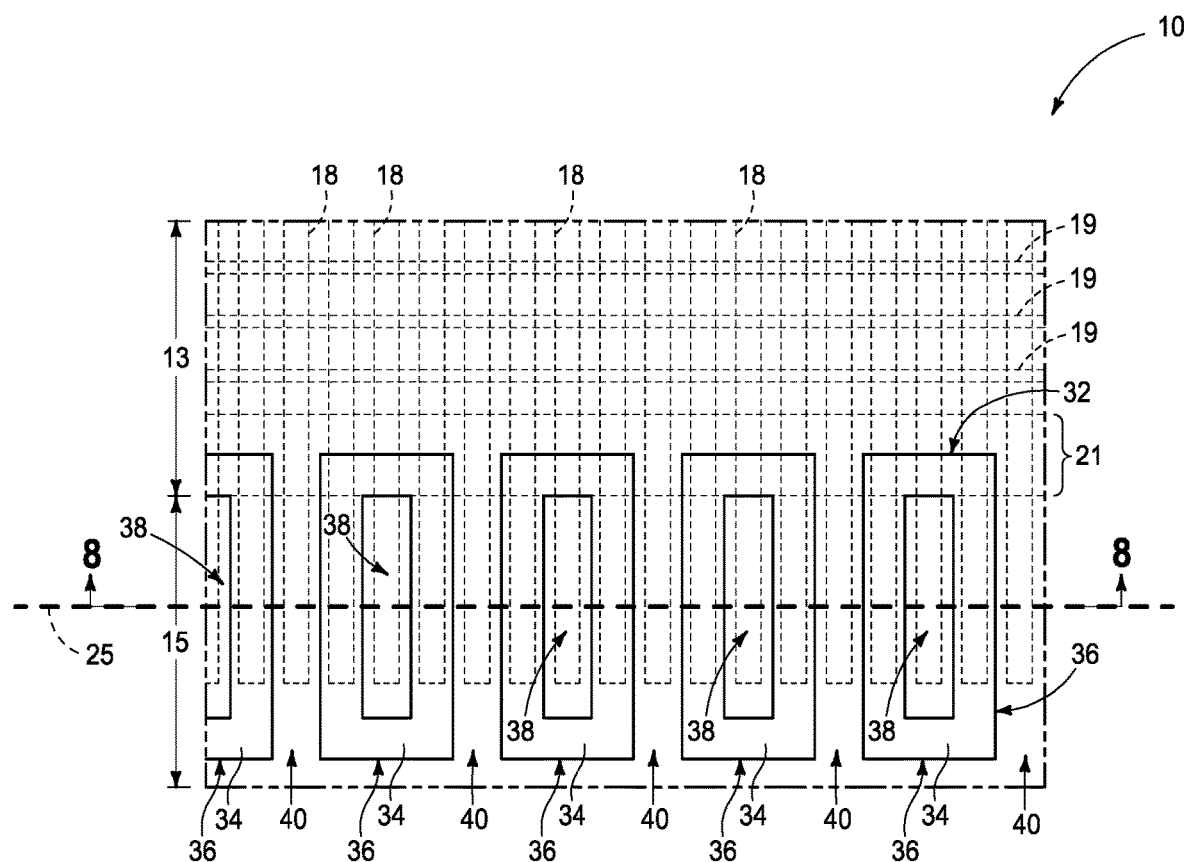
Figure 8:
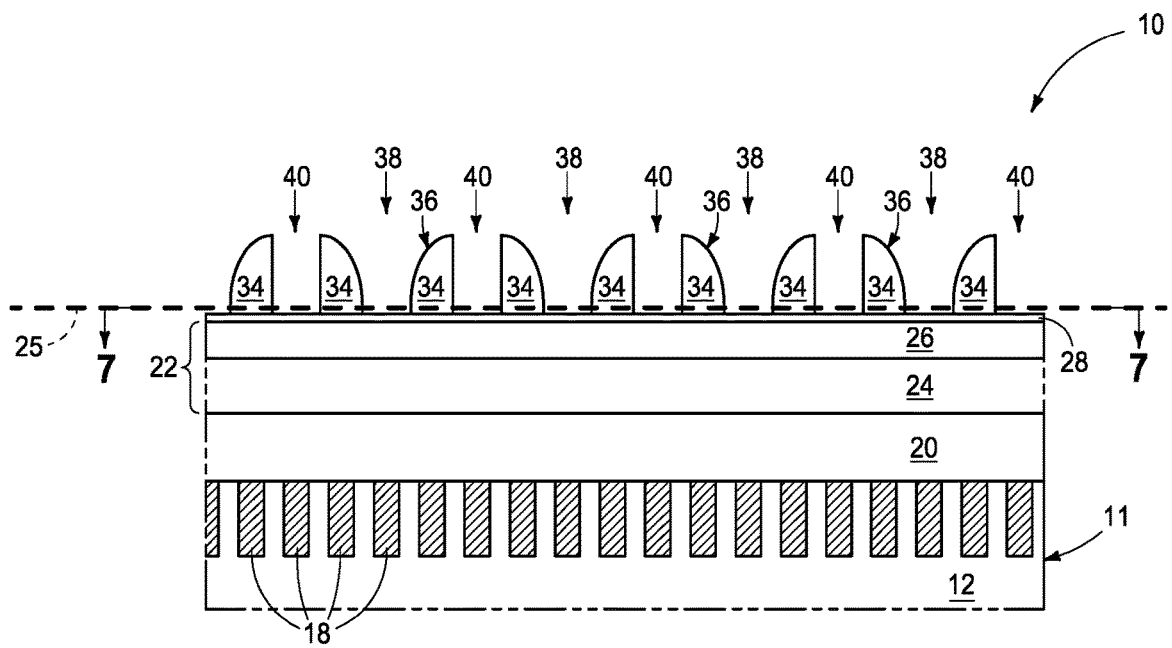

Referring to FIGS. 7 and 8, first masking material 30 (not shown) has been removed along line 25 (i.e., at least along line 25) to form a void space 40 between immediately-adjacent rings 36. Individual void spaces 40 in one embodiment are directly above another single individual conductive line 18 in second substrate area 15. An example such act of removing comprises etching and, regardless, in one embodiment wherein removing of first masking material 30 is conducted selectively relative to second masking material 34.

Figure 9:
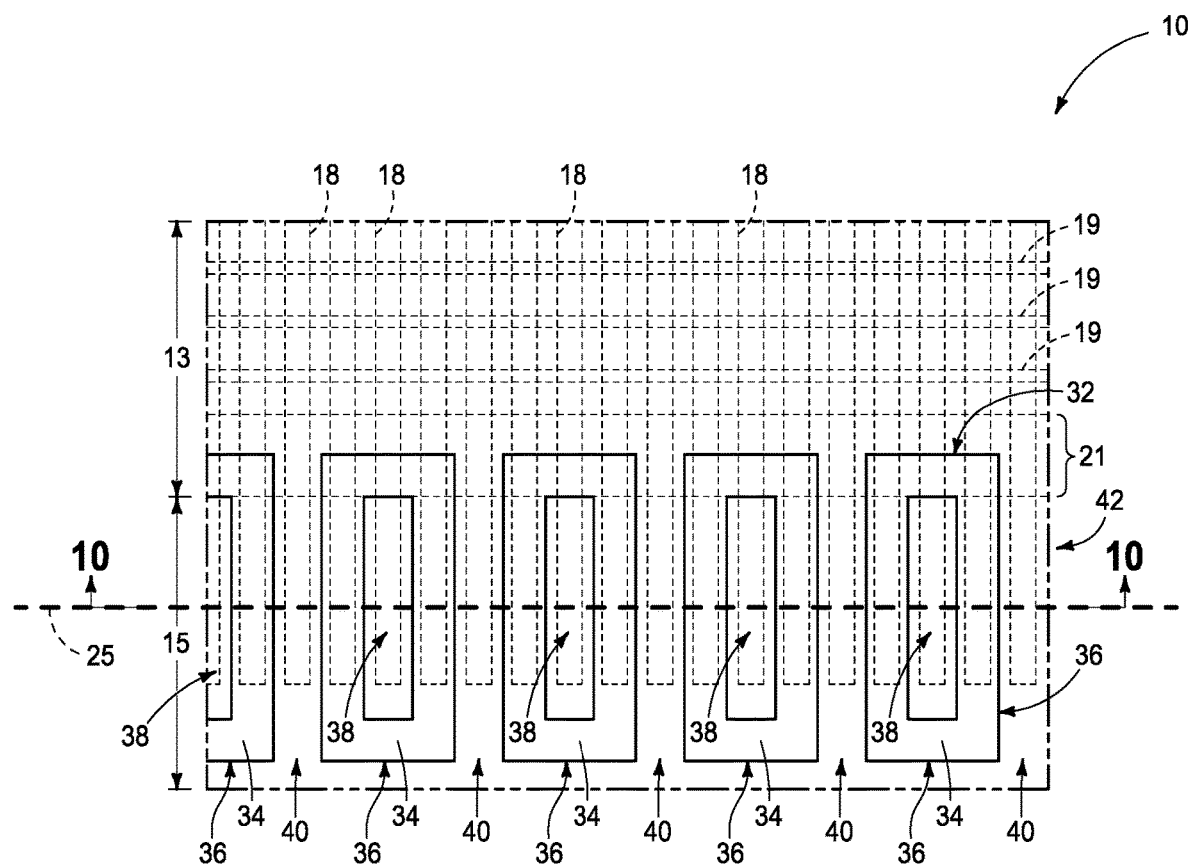
Figure 10:
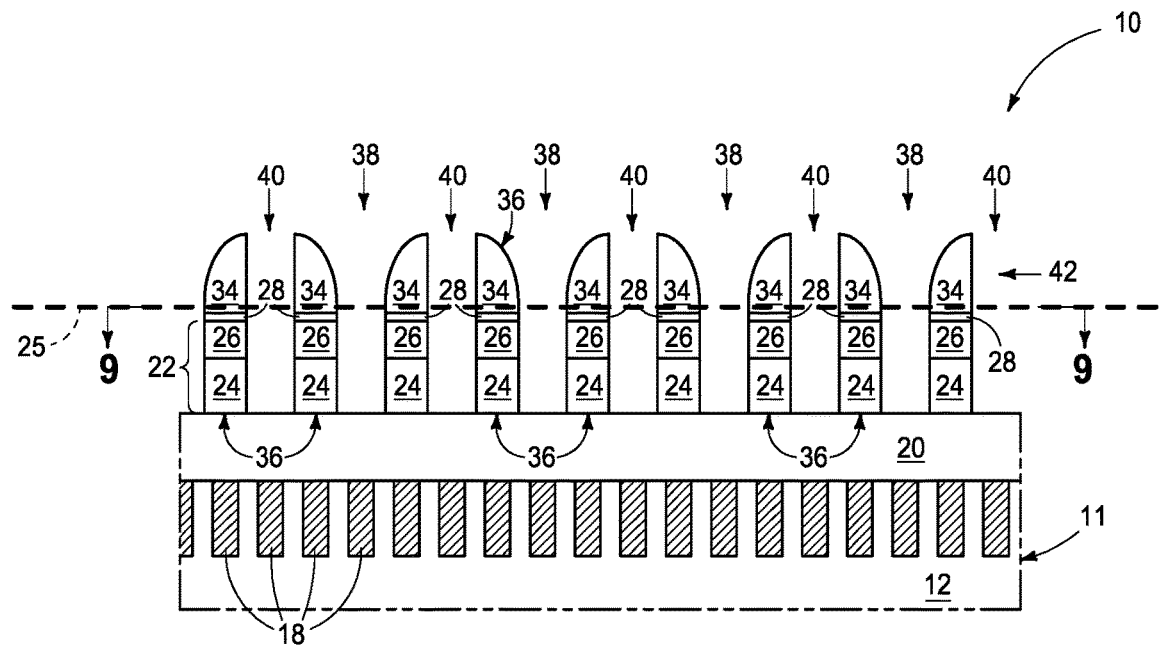

Referring to FIGS. 9 and 10, and in one embodiment where outer hard-masking material 22 is used, rings 36 have been used as an etching mask 42 while etching into hard-masking material 22 (and antireflective coating 28 when present) to form rings 36 in hard-masking material 22.

Figure 11:
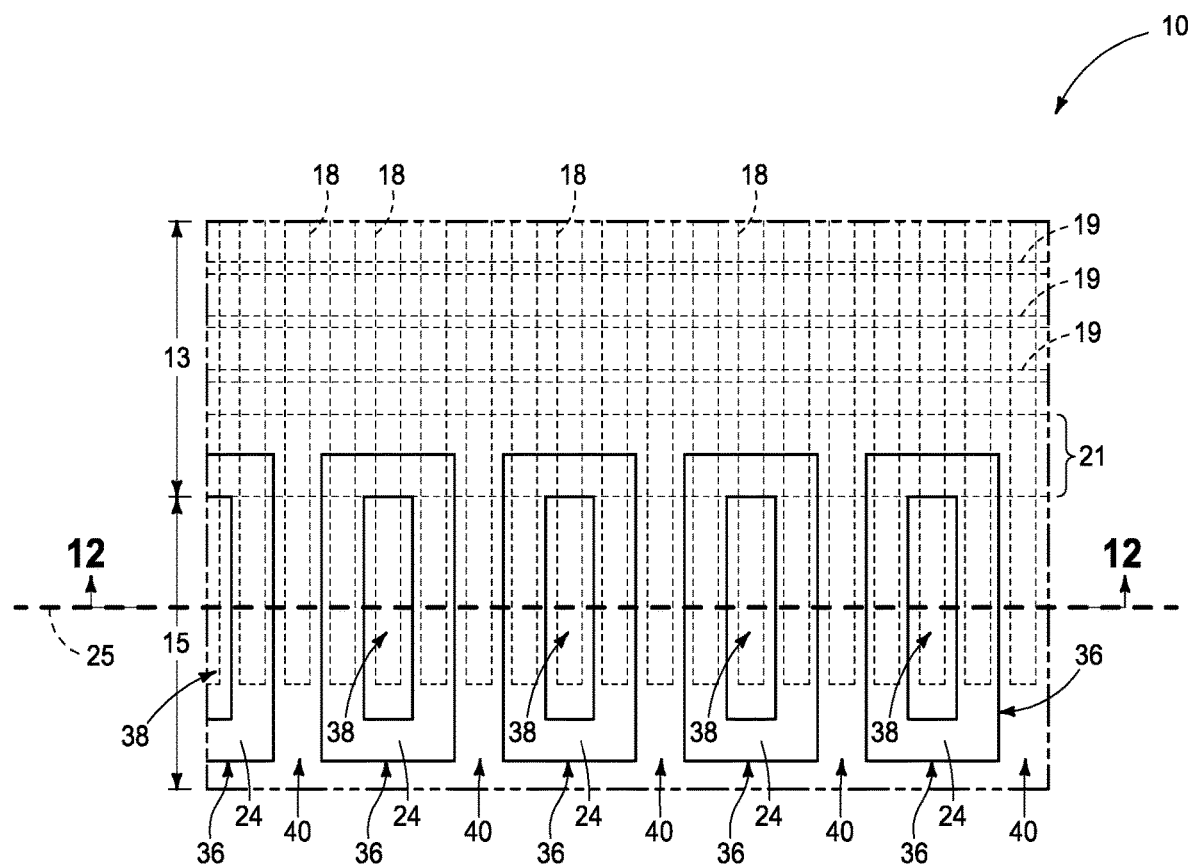
Figure 12:
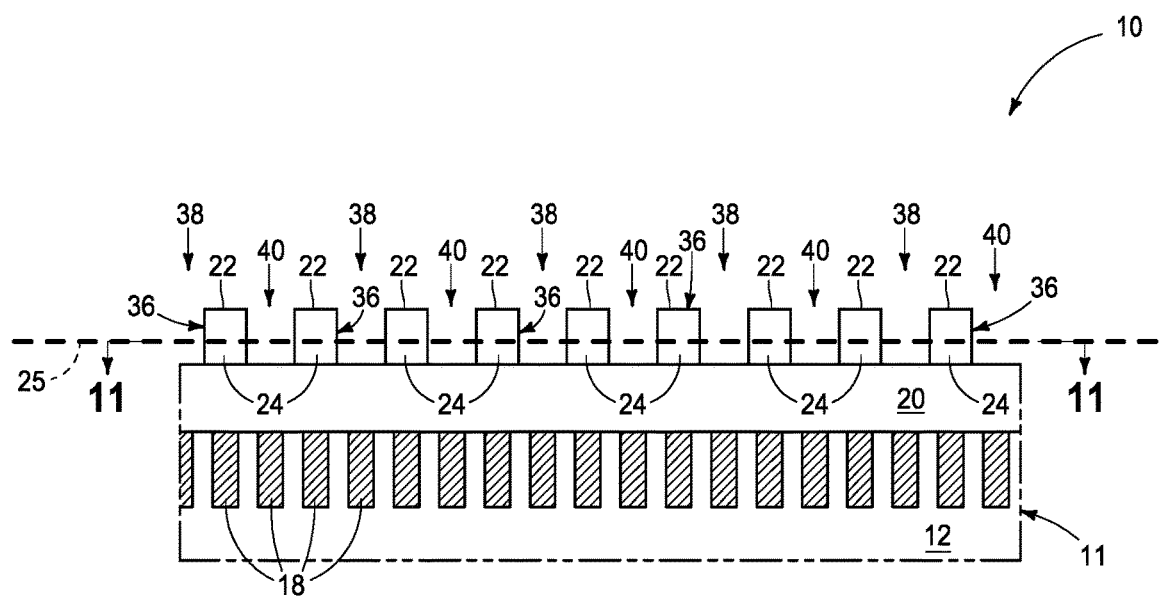

Referring to FIGS. 11 and 12, second masking material 34 (not shown), antireflective coating 28 (not shown), and upper hard-masking material 26 (not shown) have been removed, leaving rings 36 in hard-masking material 22/24.

Figure 13:
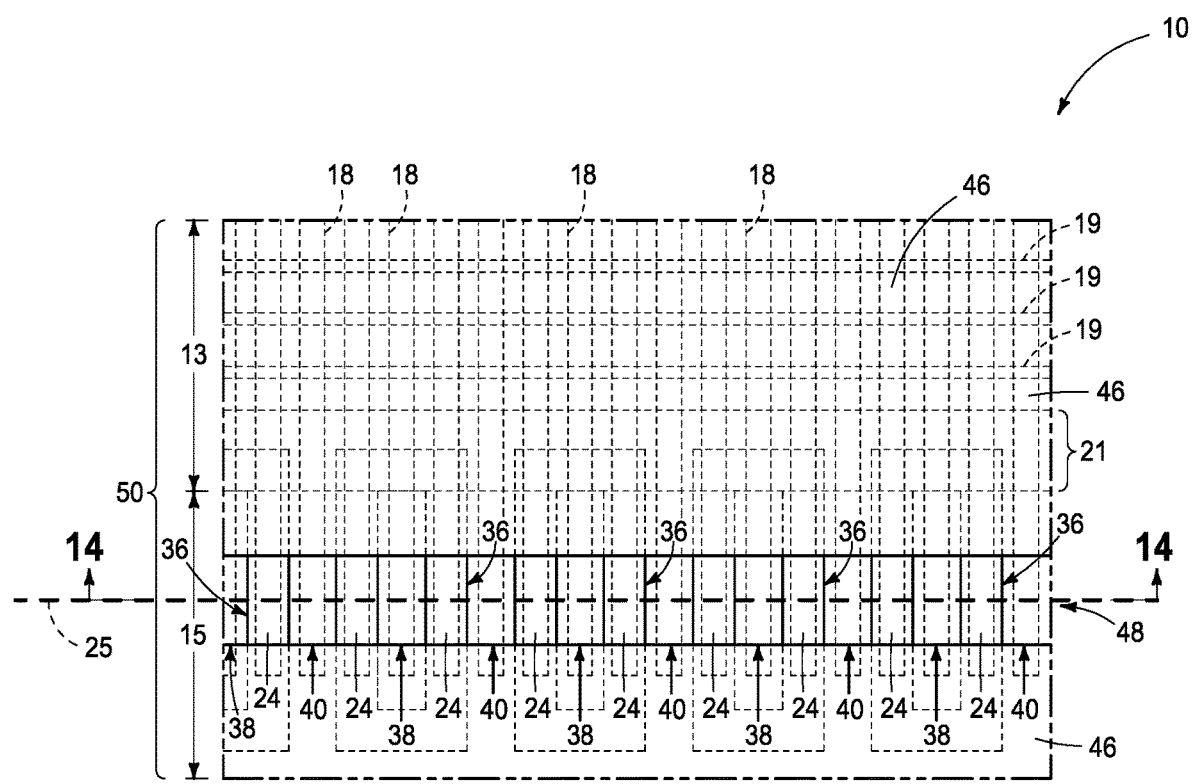
Figure 14:
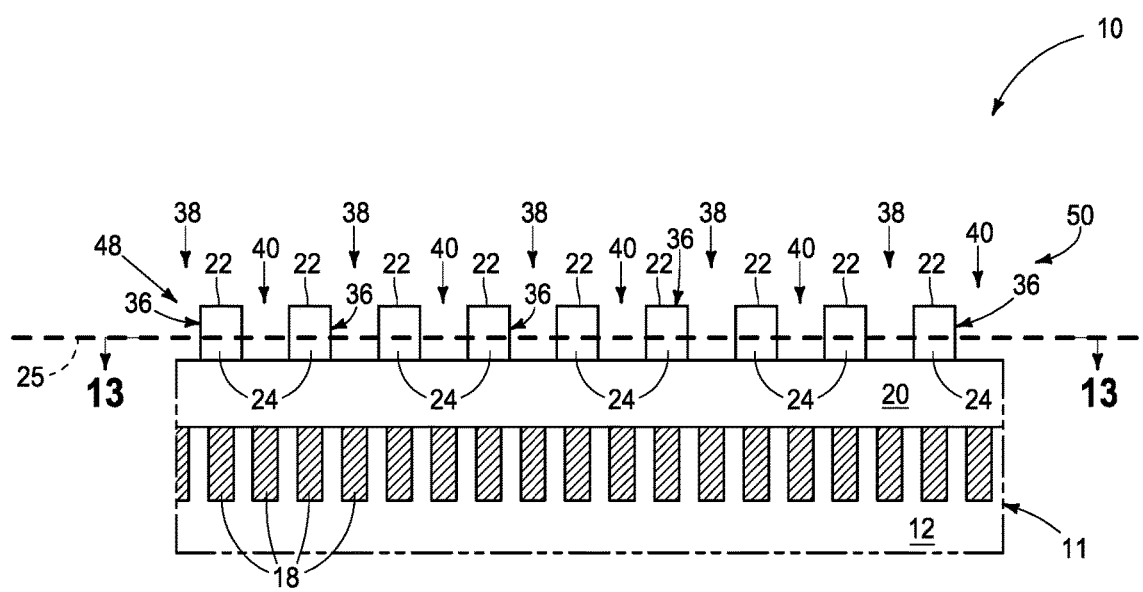

Referring to FIGS. 13 and 14, a mask 50 has been formed comprising rings 36 and a third opening 48 in third masking material 46. Third opening 48 extends along line 25 above and across multiple rings 36 and multiple second openings 38. In one embodiment and as shown, third opening 48 is centered relative to centers of multiple second openings 38. In one embodiment and as shown, third opening 48 exposes less-than-all of individual of said multiple rings 36 and less-than-all of individual second openings 38. For example, and as shown, third masking material 46 covers some portions of individual rings 36 and some portions of second openings 38. In one embodiment, third masking material 46 comprises an outermost material (e.g., photoresist) of the same composition as that of first masking material 30. In one embodiment and as shown, the removing of first masking material 30 (shown by FIGS. 7 and 8 and not shown in FIGS. 13 and 14) occurs before forming mask 50. In such example, third opening 48 extends along line 25 above and across multiple rings 36, multiple second openings 38, and multiple void spaces 40. Alternately, the removing of first masking material 30 may occur through third opening 48 after forming mask 50 (not shown).

Figure 15:
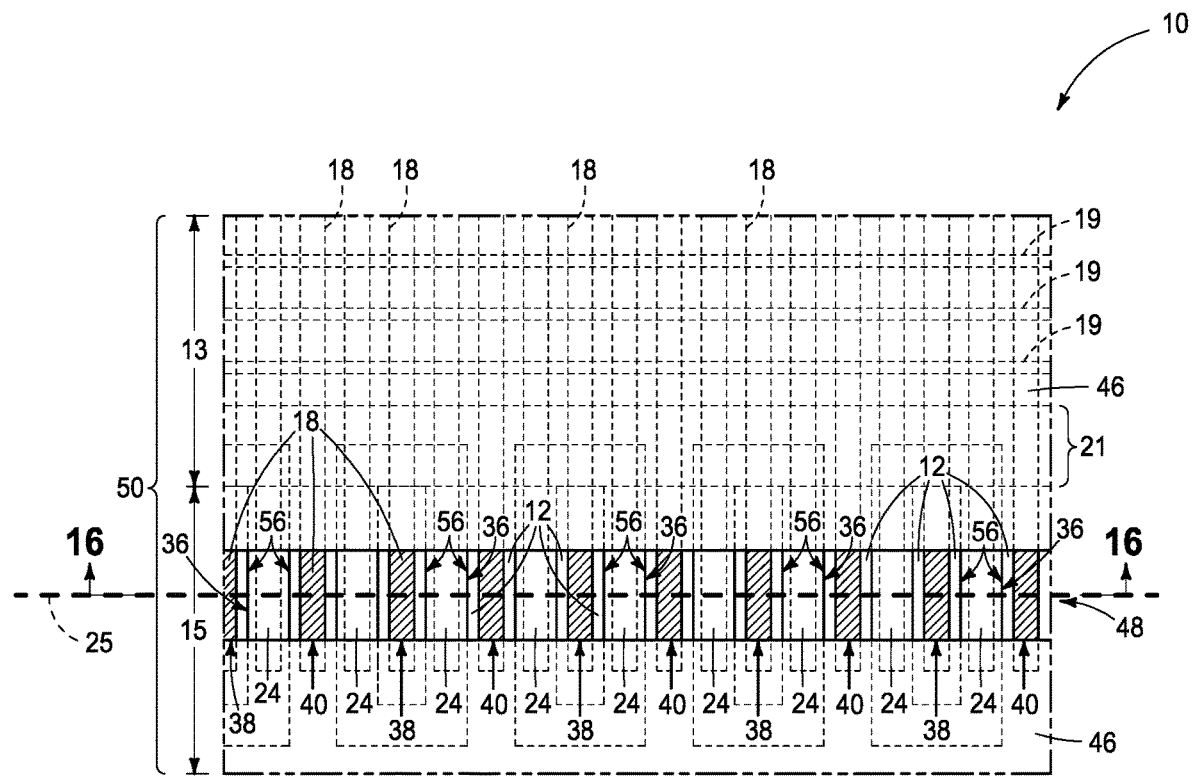
Figure 16:
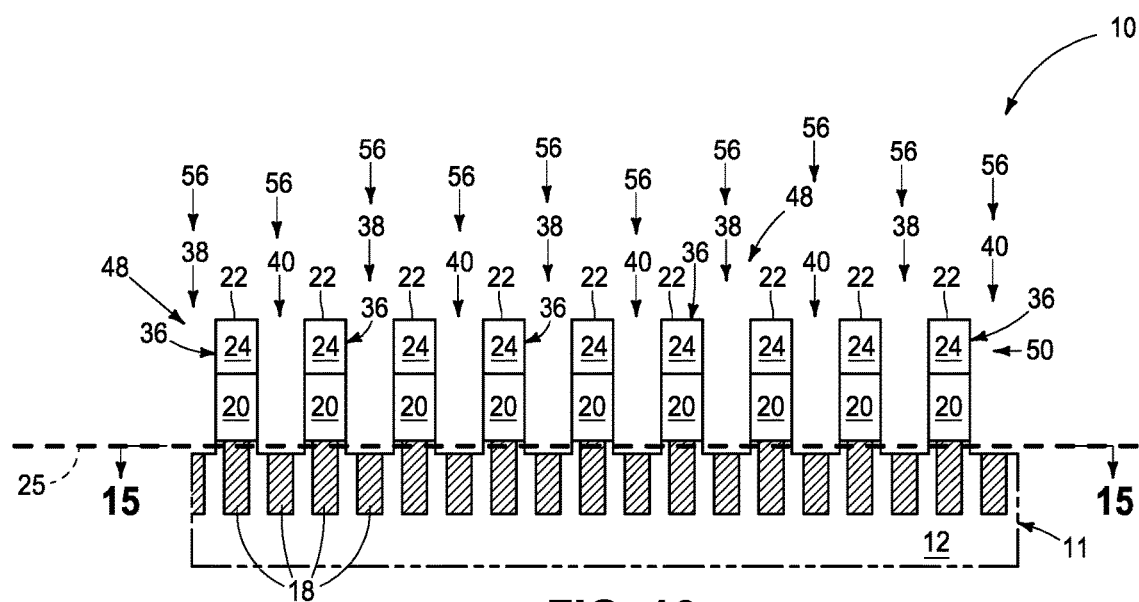
Figure 17:
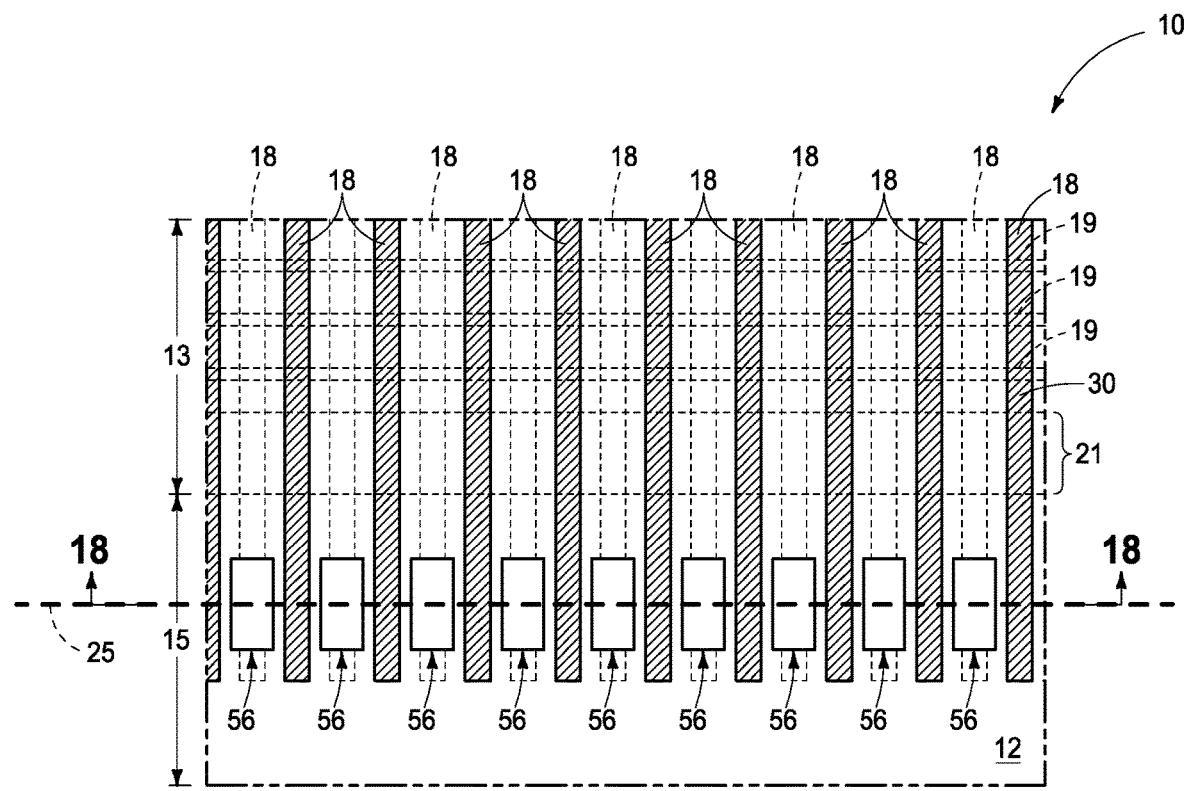
Figure 18:
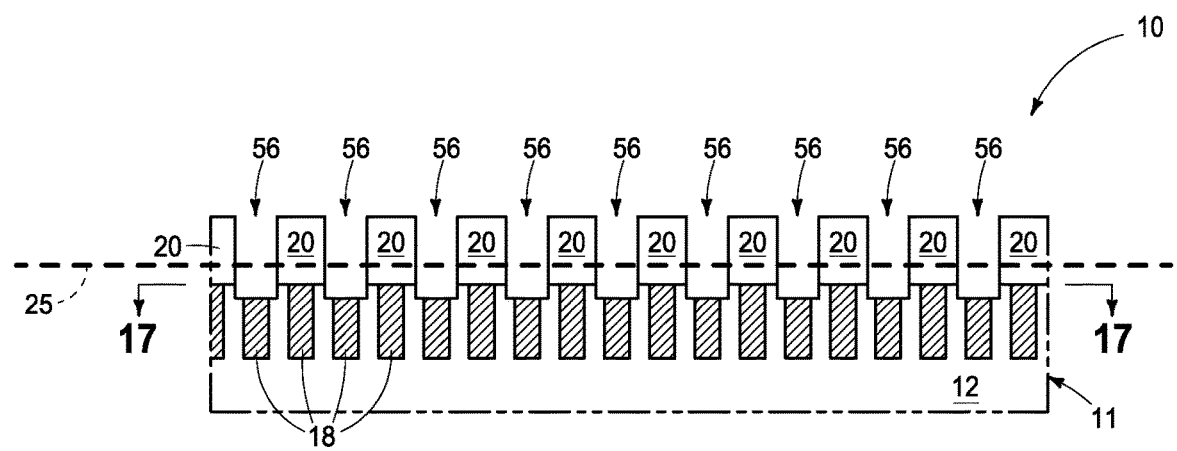

Referring to FIGS. 15 and 16, mask 50 has been used as an etch mask while etching into substrate material that is exposed through third opening 48 (e.g., materials 20 and 12, and lines 18) to form contact openings 56 in the substrate material that are spaced along line 25, and in one embodiment that extend to individual conductive lines 18. In one embodiment and as shown, such act forms contact openings 56 in the substrate material to be self-aligned along line 25. FIGS. 17 and 18 show subsequent removal of mask 50 (not shown) and hard-masking material 22/24 (not shown).

Figure 19:
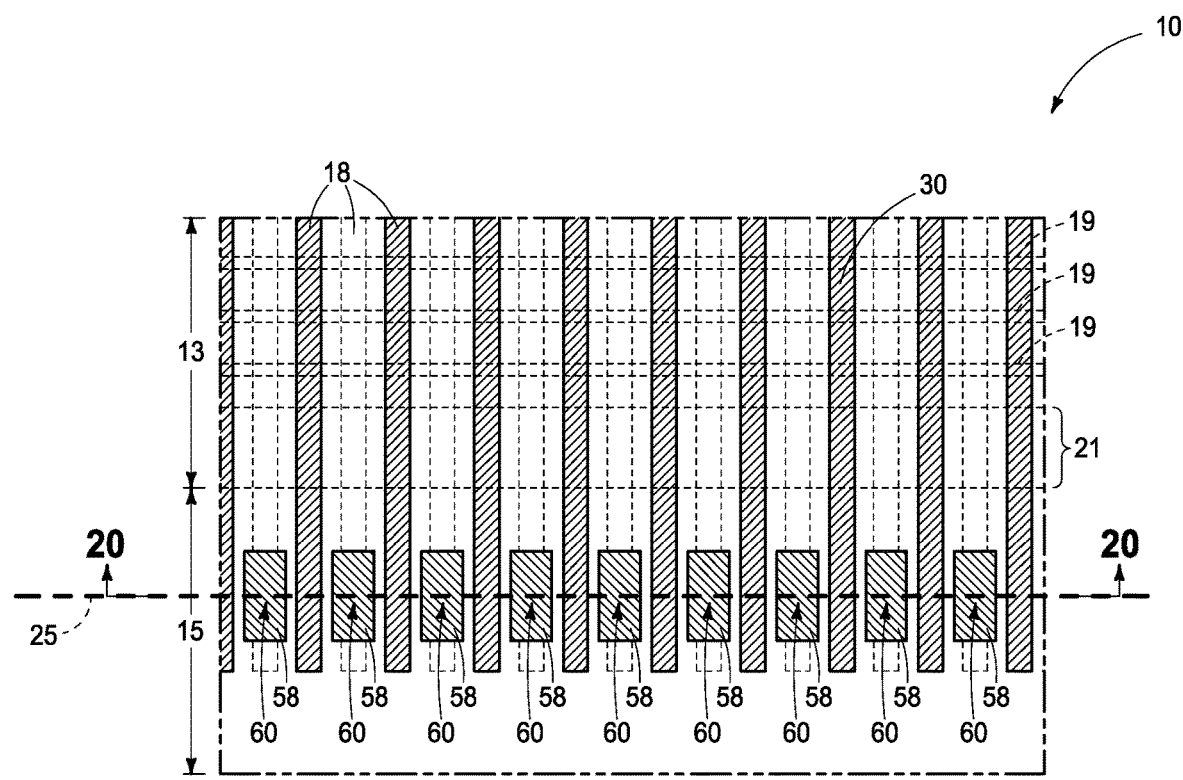
Figure 20:
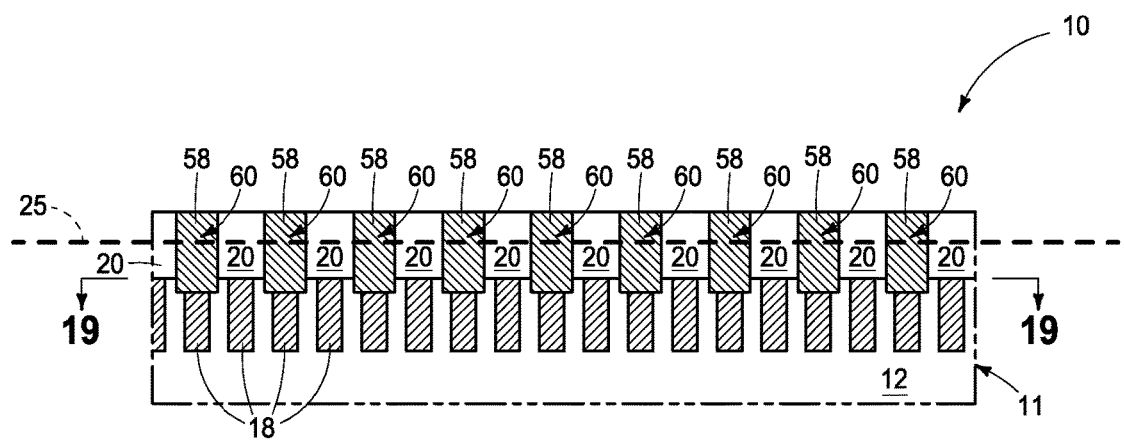

Referring to FIGS. 19 and 20, conductive material 58 has been formed in contact openings 56 to form conductive vias 60 in second substrate area 15 that are individually directly electrically coupled to one of individual conductive lines 18. In one embodiment and as shown, conductive vias 60 at least partially overlap one another in a straight-line horizontal cross-section (e.g., that of FIG. 19). In one such embodiment and as shown, conductive vias 60 are of the same size and shape area relative one another in the straight-line horizontal cross-section, with such areas totally overlapping relative one another in such straight-line horizontal cross-section.

Any other attribute(s) or aspect(s) as shown and/or described herein with respect to other embodiments may be used with respect to the above-described embodiments.

Figure 21:
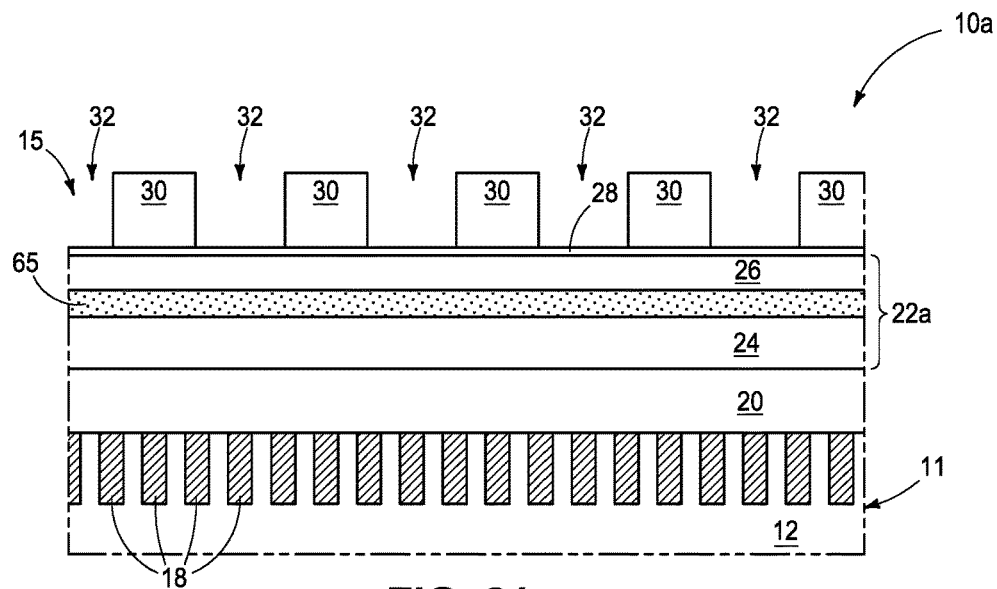
FIG. 21 is a diagrammatic cross-sectional view of a portion of a substrate construction in process in accordance with an embodiment of the invention.

FIG. 21, by way of example, shows an alternate example construction 10a comprising alternate hard-masking material 22*a*. Like numerals from the above-described embodiments have been used where appropriate, with some construction differences being indicated with the suffix "a" or with different numerals. FIG. 21 shows an alternate example substrate fragment to that shown by FIG. 2 in the first-described embodiments. Hard-masking material 22*a* comprises elemental silicon 65 between hard-masking materials 24 and 26. Any other attribute(s) or aspect(s) as shown and/or described herein with respect to other embodiments may be used.

Figure 22:
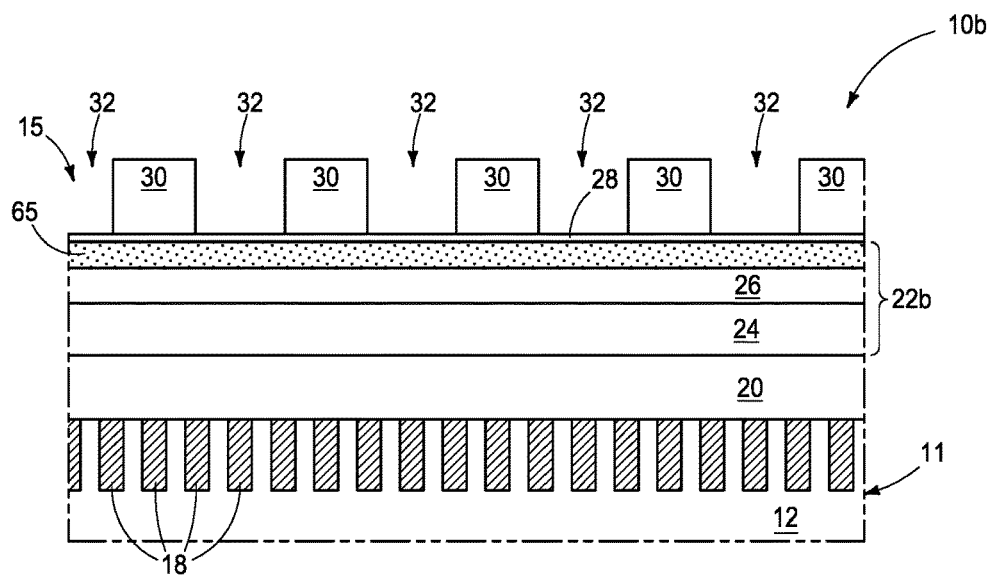
FIG. 22 is a diagrammatic cross-sectional view of a portion of a substrate construction in process in accordance with an embodiment of the invention.

FIG. 22 shows an alternate example embodiment construction 10*b* comprising a hard-masking material 22*b* where elemental silicon 65 is between hard-masking material 26 and antireflective coating 28. Like numerals from the above-described embodiments have been used where appropriate, with some construction differences being indicated with the suffix "b". Any other attribute(s) or aspect(s) as shown and/or described herein with respect to other embodiments may be used.

Figure 23:
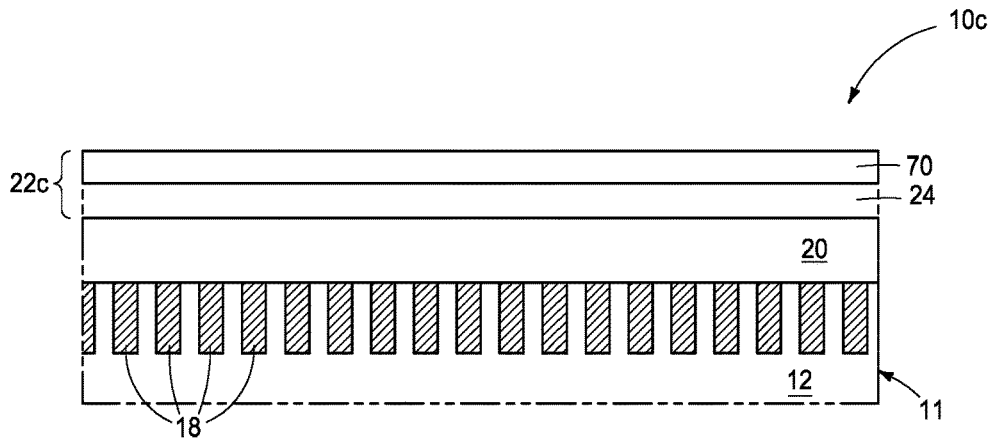
FIG. 23 is a diagrammatic cross-sectional view of a portion of a substrate construction in process in accordance with an embodiment of the invention.

FIGS. 23-26 show alternate example processing relative to a construction 10*c* comprising alternate outer hard-masking material 22*c*. Like numerals from the above-described embodiments have been used where appropriate, with some construction differences being indicated with the suffix "c" or with different numerals. Referring to FIG. 23, such shows an outer hard-masking material 22*c* comprising carbon 24 under, for example, a multi-layer antireflective coating 70 which for simplicity is shown as a single layer 70.

Figure 24:
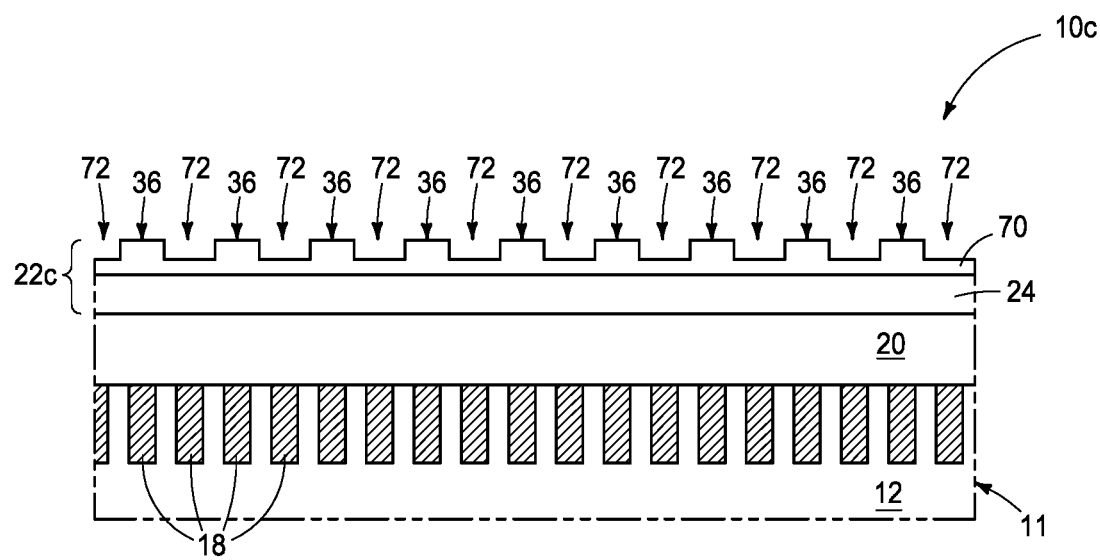
FIGS. 24-26 are diagrammatic sequential cross-sectional views of the construction of FIG. 23 in process in accordance with some embodiments of the invention.

Referring to FIG. 24, such shows processing analogous to that shown through FIG. 10, with partial-etching having been conducted into layer 70 to form openings 72 therein and after removal of second masking material 34 (not shown) having occurred thereafter.

Figure 25:
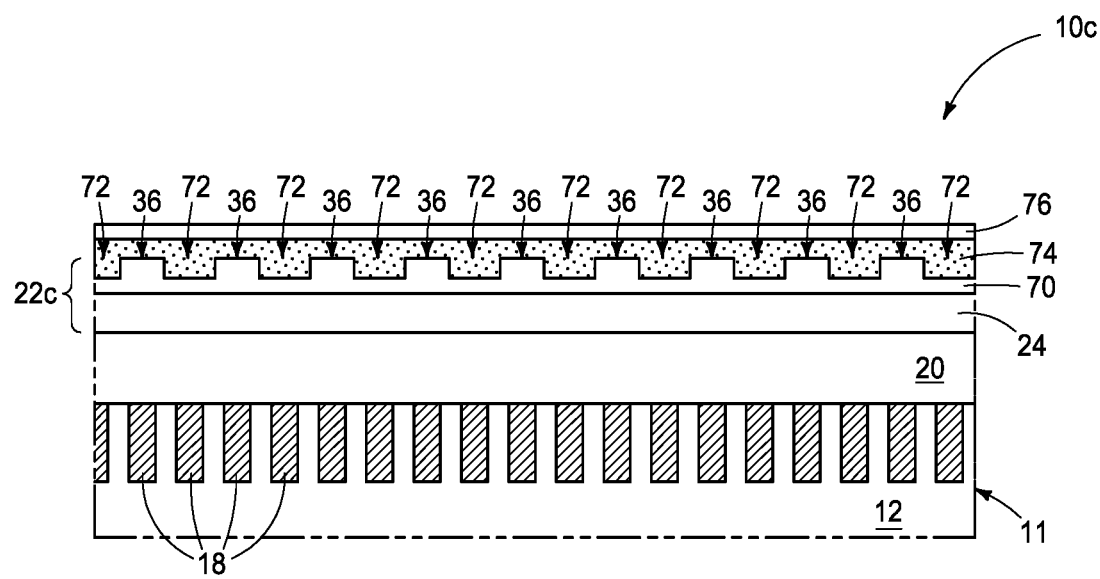
Figure 26:
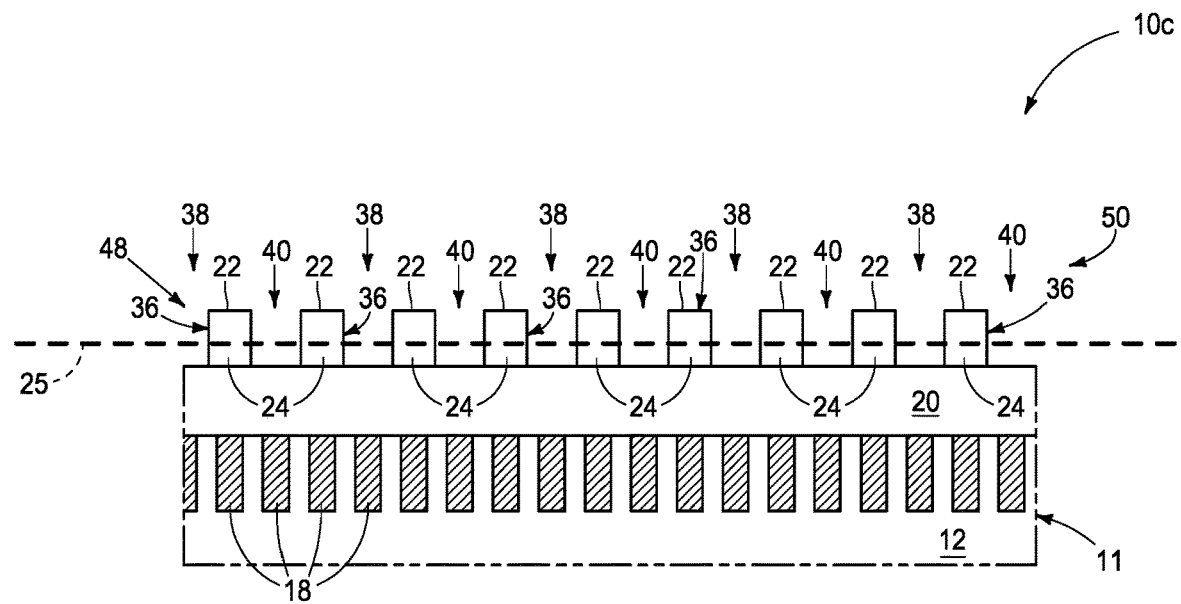

Referring to FIG. 25, an example spin-on layer 74 has been formed atop coating/material 70 and within openings 72, and another antireflective coating 76 has been deposited thereover. FIG. 26 shows transfer of the effective mask of material 70/74/76 (not shown) into and through underlying carbon layer 24 to produce, for example, the same construction as that of FIG. 14. Processing could occur subsequently as described above.

Figure 27:
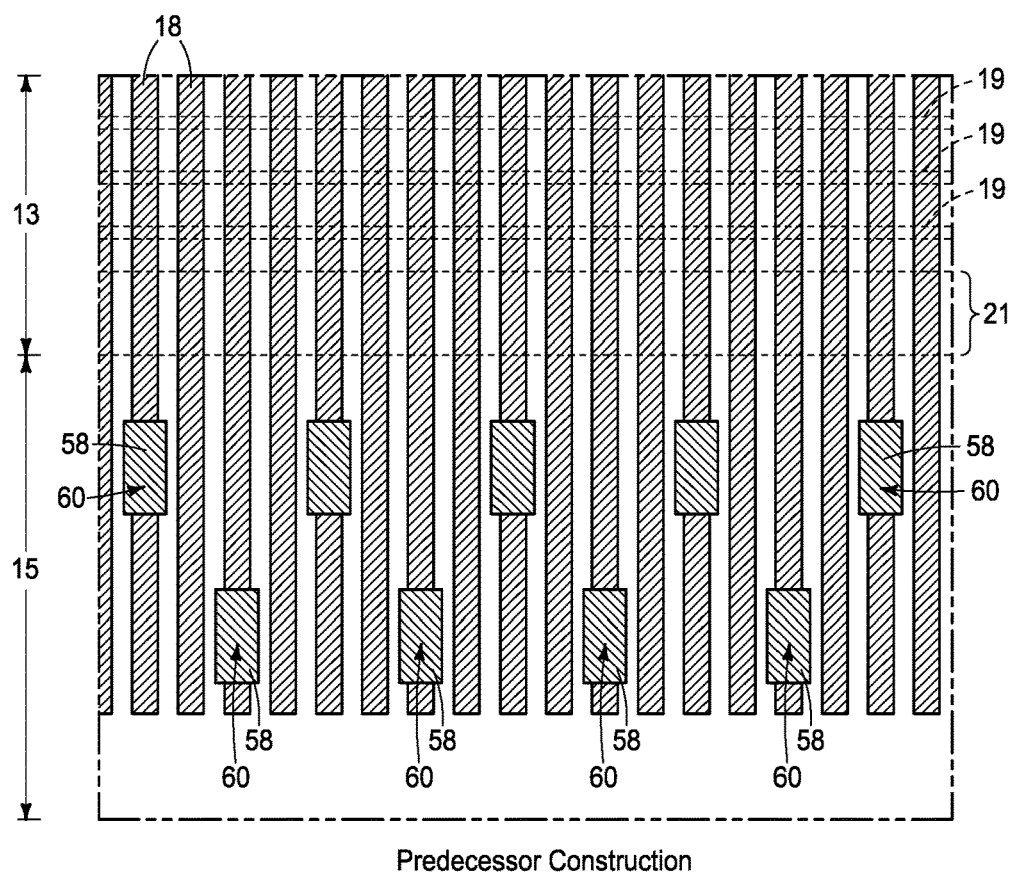
FIG. 27 is a diagrammatic cross-sectional view of a portion of a predecessor construction substrate and corresponding in processing sequence to the substrate construction of FIG. 19.

FIG. 27 shows a predecessor construction to that shown by FIG. 19. In such, conductive vias 60 are staggered wherein, for example, there is no overlap of vias 60. Processing in accordance with the invention may enable shortening of lines 18 extending within second area 15 wherein horizontal space may be reduced (e.g., area 15 in FIG. 19 is shorter than area 15 in FIG. 27).

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Herein, "self-aligned" means a technique whereby at least a lateral surface of a subsequent structure (e.g., an opening) is defined at least in part by deposition of material against a sidewall of a previously patterned structure.

Unless otherwise indicated, use of "or" herein encompasses either and both.

CONCLUSION

In some embodiments, a method of forming conductive vias of integrated circuitry comprises forming first openings in a first masking material, with the first openings being spaced along a line passing across the first openings. Sidewalls of the first openings are lined with a second masking material to form a ring within individual of the first openings and a second opening within the individual first openings radially inside of the ring. The first masking material is removed along the line to form a void space between immediately-adjacent of the rings. A mask is formed that comprises the rings and a third opening in third masking material, with the third opening extending along the line above and across multiple of the rings and multiple of the second openings. The mask is used as an etch mask while etching into substrate material that is exposed through the third opening to form contact openings in the substrate material that are spaced along the line. Conductive material is formed in the contact openings to form conductive vias.

In some embodiments, a method of forming conductive vias of integrated circuitry comprises forming first openings in a first masking material, with the first openings being spaced along a straight line passing across the first openings. Sidewalls of the first openings are lined with a second masking material to form a ring within individual of the first openings and a second opening within the individual first openings radially inside of the ring. The ring is longer than it is wide. The first and second masking materials are of different compositions relative one another. The first masking material is removed selectively relative to the second masking material along the straight line to form a void space between immediately-adjacent of the rings. After removing the first masking material, a mask is formed that comprises the rings and a third opening in third masking material. The third openings extend along the straight line above and across multiple of the rings, multiple of the second openings, and multiple of the void spaces. The third opening is centered relative to centers of the multiple second openings. The third opening exposes less-than-all of individual of said multiple rings and less-than-all of individual of said second openings. The mask is used as an etch mask while etching into substrate material that is exposed through the third opening to form contact openings in the substrate material that are spaced along the straight line, with said using comprising forming the contact openings in the substrate material to be self-aligned along the straight line. Conductive material is formed in the contact openings to form conductive vias, with the conductive-vias at least partially overlapping relative one another in the straight-line horizontal cross-section.

In some embodiments, a method of forming conductive vias comprises forming a plurality of conductive lines extending longitudinally from a first substrate area into a second substrate area. First openings are formed in a first masking material, with the first openings being spaced along a line passing across the first openings and the line of the first openings crossing the conductive lines in the second substrate area. Sidewalk of the first openings are lined with a second masking material to form a ring within individual of the first openings and a second opening within the individual first openings radially inside of the ring. Individual of the second openings are directly above a single individual of the conductive lines in the second substrate area. The first masking material is removed along the line of the first openings to form a void space between immediately-adjacent of the rings. Individual of the void spaces are directly above another single individual of the conductive lines in the second substrate area. A mask is formed that comprises the rings and a third opening in third masking material, with the third opening extending above and across multiple of the rings and multiple of the second openings. The mask is used as an etch mask while etching into substrate material that is exposed through the third opening to form spaced contact openings in the substrate material to the individual conductive lines. Conductive material is formed in the contact openings to form conductive vias in the second substrate area that are individually directly electrically coupled to one of the individual conductive lines.

In some embodiments, a method of forming memory circuitry comprises forming a plurality of conductive lines extending longitudinally from a memory array area to a peripheral circuitry area adjacent the memory array area, with the conductive lines comprising a series of (a) wordlines, or (h) digitlines. First openings are formed in a first masking material in the peripheral circuitry area, with the first openings being spaced along a line passing across the first openings. The line of the first openings crosses the conductive lines in the peripheral circuitry area. Sidewalls of the first openings are lined with a second masking material to form a ring within individual of the first openings and a second opening within the individual first openings radially inside of the ring. Individual of the second openings are directly above a single individual of the conductive lines in the peripheral circuitry area. The first masking material is removed along the line of the first openings to form a void space between immediately-adjacent of the rings, with individual of the void spaces being directly above another single individual of the conductive lines in the peripheral circuitry area. A mask is formed that comprises the rings and a third opening in third masking material, with the third opening extending across multiple of the rings and multiple of the second openings. The mask is used as an etch mask while etching into substrate material that is exposed through the third opening to form spaced peripheral contact openings in the substrate material to the individual conductive lines. Conductive material is formed in the contact openings to form conductive vias in the peripheral circuitry area that are individually directly electrically coupled to one of the individual conductive lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming conductive vias of integrated circuitry, comprising:
    forming first openings in a first masking material, the first openings being spaced along a line passing across the first openings;
    lining sidewalls of the first openings with a second masking material to form a ring within individual of the first openings and a second opening within the individual first openings radially inside of the ring;
    removing the first masking material along the line to form a void space between immediately-adjacent of the rings;
    forming a mask comprising the rings and a third opening in third masking material, the third opening extending along the line above and across multiple of the rings and multiple of the second openings;
    using the mask as an etch mask while etching into substrate material that is exposed through the third opening to form contact openings in the substrate material that are spaced along the line; and
    forming conductive material in the contact openings to form conductive vias.

2. The method of claim 1 wherein the line is straight.

3. The method of claim 1 wherein the line is not straight.

4. The method of claim 1 wherein the rings are individually longer than they are wide.

5. The method of claim 1 wherein the conductive vias at least partially overlap one another in a straight-line horizontal cross-section.

6. The method of claim 5 wherein the conductive vias are of the same size and shape area relative one another in the straight-line horizontal cross-section, the conductive-via areas totally overlapping relative one another in the straight-line horizontal cross-section.

7. The method of claim 1 wherein the first and second masking materials are of different compositions relative one another, the removing of the first masking material being selective relative to the second masking material.

8. The method of claim 1 wherein the forming of the first openings in the first masking material comprises:
    forming narrower first openings in the first masking material;
    laterally etching the first material to transform the narrower first openings into wider first openings; and
    the rings being individually formed in the wider first openings.

9. The method of claim 1 wherein the removing of the first masking material occurs before forming the mask.

10. The method of claim 1 wherein the removing of the first masking material occurs through the third opening after forming the mask.

11. The method of claim 1 wherein the third opening is centered relative to centers of the multiple second openings.

12. The method of claim 1 wherein the third opening exposes less-than-all of individual of said multiple rings and less-than-all of individual of said second openings.

13. The method of claim 1 wherein the third masking material comprises an outermost material of the same composition as that of the first masking material.

14. The method of claim 13 wherein the first and second masking materials are of different compositions relative one another, the removing of the first masking material being selective relative to the second masking material.

15. The method of claim 1 wherein said using comprises forming the contact openings in the substrate material to be self-aligned along the line.

16. The method of claim 1 wherein the substrate material comprises outer hard-masking material and further comprising:
    using the rings as an etching mask while etching into the hard-masking material to form rings in the hard-masking material; and
    said using comprising using the etch mask to form the contact openings in the substrate material to be self-aligned along the line.

17. The method of claim 16 wherein the substrate material comprises an antireflective coating above the hard-masking material.

18. The method of claim 17 comprising elemental silicon between the hard-masking material and the antireflective coating.

19. The method of claim 16 wherein the hard-masking material comprises carbon above elemental silicon.

20. A method of forming conductive vias of integrated circuitry, comprising:
forming first openings in a first masking material, the first openings being spaced along a straight line passing across the first openings;
lining sidewalls of the first openings with a second masking material to form a ring within individual of the first openings and a second opening within the individual first openings radially inside of the ring, the ring being longer than it is wide, the first and second masking materials being of different compositions relative one another;
removing the first masking material selectively relative to the second masking material along the straight line to form a void space between immediately-adjacent of the rings;
after removing the first masking material, forming a mask comprising the rings and a third opening in third masking material; the third openings extending along the straight line above and across multiple of the rings, multiple of the second openings, and multiple of the void spaces; the third opening being centered relative to centers of the multiple second openings;
the third opening exposing less-than-all of individual of said multiple rings and less-than-all of individual of said second openings;
using the mask as an etch mask while etching into substrate material that is exposed through the third opening to form contact openings in the substrate material that are spaced along the straight line, said using comprises forming the contact openings in the substrate material to be self-aligned along the straight line; and
forming conductive material in the contact openings to form conductive vias, the conductive-vias at least partially overlapping relative one another in the straight-line horizontal cross-section.

21. The method of claim 20 wherein the forming of the first openings in the first masking material comprises:
forming narrower first openings in the first masking material;
laterally etching the first material to transform the narrower first openings into wider first openings; and
the rings being individually formed in the wider first openings.

22. The method of claim 20 wherein the substrate material comprises outer hard-masking material and further comprising:
using the rings as an etching mask while etching into the hard-masking material to form rings in the hard-masking material; and
said using comprising using the etch mask to form the contact openings in the substrate material to be self-aligned along the line.

23. A method of forming conductive vias, comprising:
forming a plurality of conductive lines extending longitudinally from a first substrate area into a second substrate area;
forming first openings in a first masking material, the first openings being spaced along a line passing across the first openings, the line of the first openings crossing the conductive lines in the second substrate area;
lining sidewalls of the first openings with a second masking material to form a ring within individual of the first openings and a second opening within the individual first openings radially inside of the ring, individual of the second openings being directly above a single individual of the conductive lines in the second substrate area;
removing the first masking material along the line of the first openings to form a void space between immediately-adjacent of the rings, individual of the void spaces being directly above another single individual of the conductive lines in the second substrate area;
forming a mask comprising the rings and a third opening in third masking material, the third opening extending above and across multiple of the rings and multiple of the second openings;
using the mask as an etch mask while etching into substrate material that is exposed through the third opening to form spaced contact openings in the substrate material to the individual conductive lines; and
forming conductive material in the contact openings to form conductive vias in the second substrate area that are individually directly electrically coupled to one of the individual conductive lines.

24. The method of claim 23 wherein the individual first openings are longitudinally elongated, and the rings are individually longer than they are wide.

25. The method of claim 23 wherein the individual first openings are longitudinally elongated parallel the conductive lines and the rings are individually longitudinally elongated parallel the conductive lines.

26. The method of claim 23 wherein the line of the first openings is straight.

27. A method of forming memory circuitry, comprising:
forming a plurality of conductive lines extending longitudinally from a memory array area to a peripheral circuitry area adjacent the memory array area, the conductive lines comprising a series of (a) wordlines, or (b) digitlines;
forming first openings in a first masking material in the peripheral circuitry area, the first openings being spaced along a line passing across the first openings, the line of the first openings crossing the conductive lines in the peripheral circuitry area;
lining sidewalls of the first openings with a second masking material to form a ring within individual of the first openings and a second opening within the individual first openings radially inside of the ring, individual of the second openings being directly above a single individual of the conductive lines in the peripheral circuitry area;
removing the first masking material along the line of the first openings to form a void space between immediately-adjacent of the rings, individual of the void spaces being directly above another single individual of the conductive lines in the peripheral circuitry area;
forming a mask comprising the rings and a third opening in third masking material, the third opening extending across multiple of the rings and multiple of the second openings;
using the mask as an etch mask while etching into substrate material that is exposed through the third opening to form spaced peripheral contact openings in the substrate material to the individual conductive lines;

forming conductive material in the contact openings to form conductive vias in the peripheral circuitry area that are individually directly electrically coupled to one of the individual conductive lines.

28. The method of claim 27 wherein the series is (a).
29. The method of claim 27 wherein the series is (b).

* * * * *